United States Patent [19]

Suzuki et al.

[11] Patent Number: 4,607,349
[45] Date of Patent: Aug. 19, 1986

[54] MAGNETIC BUBBLE MEMORY DEVICE

[75] Inventors: Ryo Suzuki, Kodaira; Masatoshi Takeshita, Hachiouji; Teruaki Takeuchi, Kokubunji; Naoki Kodama, Hachiouji; Yutaka Sugita, Tokyo, all of Japan

[73] Assignee: Hitachi, Ltd., Tokyo, Japan

[21] Appl. No.: 514,668

[22] Filed: Jul. 18, 1983

[30] Foreign Application Priority Data

Jul. 19, 1982 [JP] Japan .............................. 57-124451

[51] Int. Cl.⁴ ............................................. G11C 19/08
[52] U.S. Cl. ......................................... 365/39; 365/15
[58] Field of Search ............................ 365/15, 16, 39; 427/127, 128, 132

[56] References Cited

U.S. PATENT DOCUMENTS 4,104,422 8/1978 Sandfort .............................. 427/123

FOREIGN PATENT DOCUMENTS 56-148784 11/1981 Japan .

OTHER PUBLICATIONS

Journal of Applied Physics—vol. 50, No. 3; Mar. 1979, pp. 2225–2227.

*Primary Examiner*—James W. Moffitt
*Attorney, Agent, or Firm*—Charles E. Pfund

[57] ABSTRACT

A highly density magnetic bubble memory device has bubble propagation paths having different pattern periods. The distance between a propagation path having shorter period and a magnetic film for holding magnetic bubbles is made smaller than that between propagation path having longer period and the magnetic film. An insulating layer formed between the propagation path and the magnetic film through another insulating layer has a declining slope having an angle of 60° or less, thereby ensuring steady propagation of the magnetic bubbles along the propagation path.

6 Claims, 11 Drawing Figures

NON MAGNETIC SINGLE CRYSTALLINE SUBSTRATE

NON MAGNETIC SINGLE CRYSTALLINE SUBSTRATE

MAGNETIC BUBBLE MEMORY DEVICE

BACKGROUND OF THE INVENTION

I. Field of the Invention

The present invention relates to a magnetic bubble memory device and, more particularly, to a magnetic bubble memory device having a structure suitable for a high packing density.

II. Description of the Prior Art

FIG. 1 is a sectional view of a magentic bubble memory device having propagation paths made of a soft magnetic film. As will be seen from FIG. 1, thicknesses of first and second insulating layers 2 and 4 are made uniform throughout the device.

The conventional device of the type described above is easy to manufacture, but its characteristics are disadvantageously restricted. For example, because of the provision of a conductive layer 3 beneath a propagation path 5, a portion of the second insulating layer 4 intervening therebetween may not be made very thin. In order to solve this problem, an approach has been made as disclosed in Japanese Preliminary Patent Publication No. 56-148784. According to this proposal, as shown in FIG. 2, a second insulating layer 4 is formed only on a conductive layer 3 for a gate and in the vicinity thereof. At the same time, element 5a on the conductive layer 3 of a magnetic bubble propagation path 5 of soft magnetic film has a pattern period larger than that of the other element 5b of the path 5. In FIGS. 1 and 2, reference numeral 1 designates a magnetic film made of garnet for holding magnetic bubbles.

However, there still exist several problems in considering the structure of a magnetic bubble memory device.

As shown in FIG. 3, a magnetic bubble memory device comprises a data storage section having a plurality of minor loops 10 and a major loop (major line) 11 in association with the plurality of minor loops 10 so as to read or write data. A gate 12 is formed to connect the major line 11 with each minor loop 10 and to control transfer-in or transfer-out of the magnetic bubbles.

The gate 12 has a complex structure which disables micropatterning. In a magnetic bubble memory device of high density, as shown in FIG. 3, each minor loop 10 is formed in a single or multiple folded shape, thereby providing sufficient space for the corresponding gate 12. In FIG. 3, reference numeral 14 designates a bubble detector and 15 a bubble generator.

With the above configuration, the period of the magnetic bubble propagation path pattern constituting the major loop 11 is larger than that constituting the minor loops 10. Typically, the period of the major loop 11 is about twice or four times that of the minor loops 10.

The present inventors have made extensive studies and have found that a distance l between the magentic bubble propagation path 5 made of a soft magnetic film and the magnetic film 1 for holding magnetic bubbles need not be minimized as possible, but must be kept at an optimum value throughout the device. The optimum value varies according to the propagation path pattern period as shown in FIG. 4. Referring to FIG. 4, curves a and b indicate characteristics for pattern periods of 6 $\mu$m and 12 $\mu$m, respectively. It is apparent that a propagation path pattern with longer period requires a larger optimum value of the distance l. When the distance l becomes too small, the attraction force between the magnetic bubble and the propagation path is excessively increased. As a result, the magnetic bubble cannot run across a gap between adjacent propagation path elements. In general, a bias magnetic field margin of 10% or more is required for the propagation path. Therefore, in a magnetic bubble memory device wherein the pattern period of the major line differs from that of the minor loops, it is not preferred that the distance between the propagation path and the magnetic film is increased only at the gate as in the aforementioned publication.

SUMMARY OF THE INVENTION

The present invention has been made to eliminate the conventional drawbacks and has for its object to provide a magnetic bubble memory device having minor loops of high density without impairing bias magnetic field margin.

In order to achieve the above object of the present invention, there is provided a magnetic bubble memory device comprising:

a magnetic film for holding magnetic bubbles;

a first insulating layer formed on the magentic film;

a conductive layer selectively formed on the first insulating layer;

a second insulating layer formed on the conductive layer and part of said the insulating layer, for surrounding the conductive layer; and a bubble propagation path layer which is patterned on the second insulating layer and the first insulating layer to provide propagation path patterns of different pattern periods;

wherein the distance between said magnetic film and said bubble propagation path layer is made smaller at a propagation pattern of shorter period than at a propagation pattern of longer period.

DETAILED DESCRIPTION OF THE PREFERRED EMBODIMENTS

It is conceivable from the foregoing description to vary the distance between a bubble propagation path and a magnetic film for holding magnetic bubbles in accordance with the propagation path period in order to obviate the conventional drawbacks described above.

However, in general, a plurality of types of propagation path are formed in a single magnetic bubble memory device. In practice, it is very difficult to change the distance between each propagation path and the magnetic film for holding the magnetic bubbles.

Figure 1:
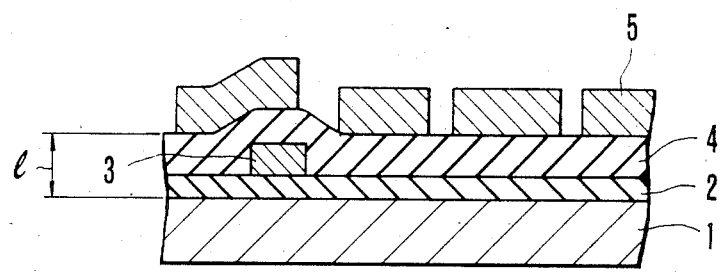
FIGS. 1 and 2 are fragmentary sectional views of conventional magnetic bubble memory devices.
Figure 2:
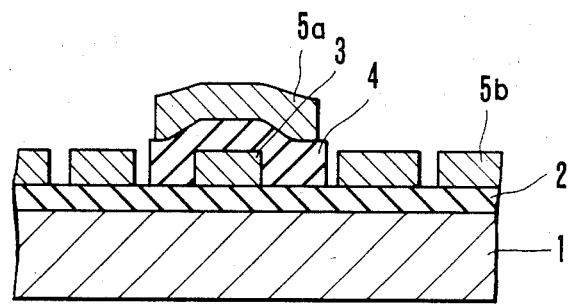
Figure 3:
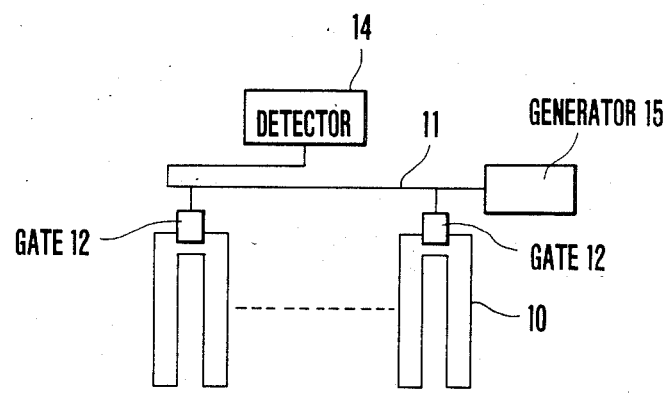
FIG. 3 is a block diagram showing the overall configuration of a magnetic bubble memory device.
Figure 5A:
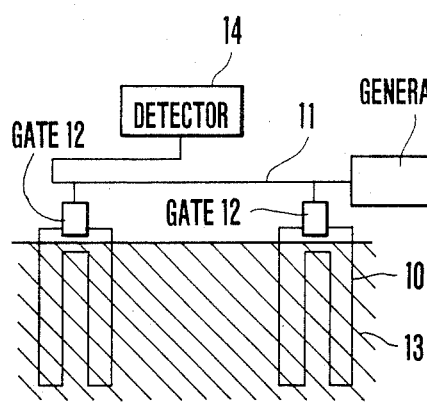
FIGS. 5a and 5b are diagrams showing the portions at which the distance l is decreased.
Figure 5B:
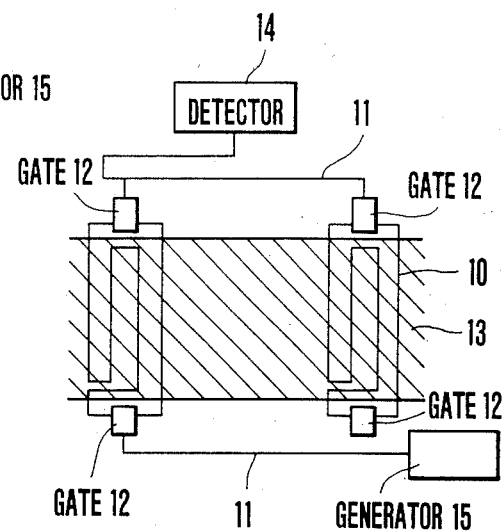

In the magnetic bubble memory device having minor loops 10 having a folded shape as shown in FIG. 3, the magnetic bubble propagation path can be divided into two sections in accordance with the pattern period; a minor loop section (excluding a gate and its vicinity) which has a very small period and requires a high packing density; and the remaining section. Therefore, as shown in FIGS. 5a and 5b showing different types of minor loop, only the thickness of an insulating layer 4 for a propagation path section corresponding to a hatched, mainly inclusive of minor loops, portion 13 needs to be decreased.

Figure 6A:
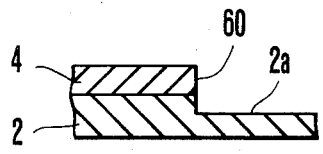
FIGS. 6a, 6b and 6c are fragmentary sectional views showing various configurations of first and second insulating layers.
Figure 6B:
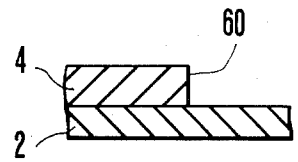
Figure 6C:
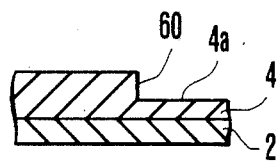

To this end, a shoulder 60 may be formed at an edge of a second insulating layer 4 made of, for example, PIQ (polyimide iso-indroquinazolinedione: trade mark of Hitachi Chemical Co., Ltd.) which is formed on a first insulating layer 2 made of, for example, $SiO_2$ in various manners as shown in FIGS. 6a to 6c. Specifically, the shoulder terminates in a recess 2a formed in the first insulating layer 2 in FIG. 6a, the shoulder terminates in the surface of the first insulating layer 2 in FIG. 6b to provide part of the first insulating layer 2 which is not covered with the second insulating layer 4, and the shoulder terminates in a recess 4a formed in the second insulating layer 4, not reaching the surface of the first insulating layer 2, in FIG. 6c. Practically, in view of ease of fabrication, the formation of the shoulder shown in FIG. 6b is preferred.

Figure 7:
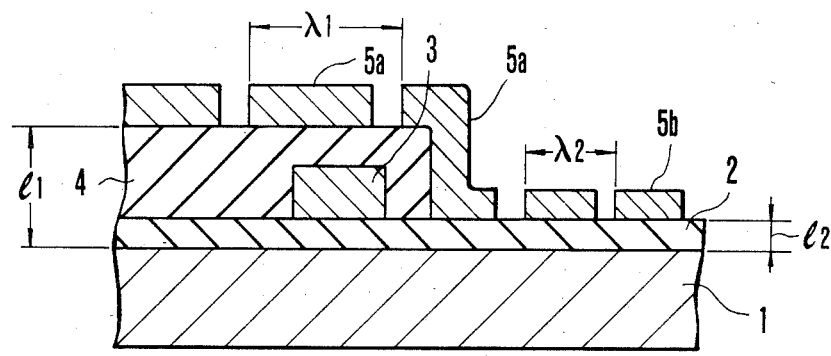
FIG. 7 is a fragmentary sectional view showing one embodiment of a magnetic bubble memory device according to the invention.

Thus, one embodiment of a magnetic bubble memory device according to the invention constructed as shown in FIG. 7. More particularly, in a bubble propagation path L pattern section of a pattern period $\lambda 2$, path elements 5b are formed directly on the first insulating layer 2 and in a bubble propagation path pattern section of a pattern period $\lambda 1$ which is larger than $\lambda 2$, path elements 5a are formed on the second insulating layer 4, so that the distance or spacing between the magnetic film 1 and the propagation path measures l2 in the former section and l1 in the latter section, with l2 being smaller than l1. The $\lambda 2$ period section is used for the minor loops and the $\lambda 1$ period section for the major loop and gate. In FIG. 7, it should be noted that the magnetic film 1 is formed on the non magnetic single crystalline substrate as well known.

Figure 4:
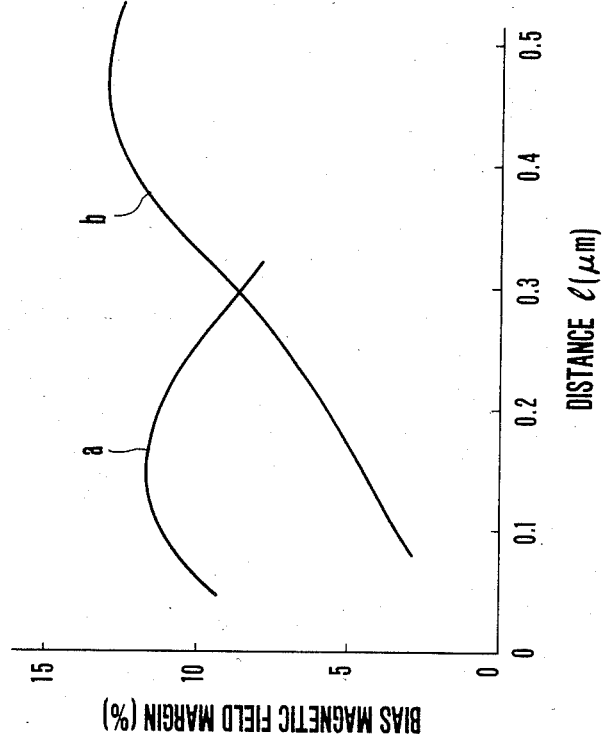
FIG. 4 is a graph for explaining the relation between bias magnetic field margin and the distance l ($\mu$m) between the magnetic bubble propagation path and the magnetic film with parameters of pattern period.

With reference to FIG. 4, structural dimensions necessary for obtaining 10% or more margin are exemplified as follows: $\lambda 1 \geq 12$ $\mu$m; l1=0.53 $\mu$m for $\lambda 1 = 12$ $\mu$m; $\lambda 2 \geq 6$ $\mu$m; $\lambda 2 = 4$ to 6 $\mu$m and l2=0.15 to 0.3 $\mu$m, especially, l2=0.18 $\mu$m for $\lambda 2 = 4$ $\mu$m. Particularly, l1$\geq$0.3 $\mu$m for $\lambda 1 \geq 12$ $\mu$m, and l2$\geq$0.25 $\mu$m for $\lambda 2 \geq 6$ $\mu$m provide a preferable range.

Figure 8:
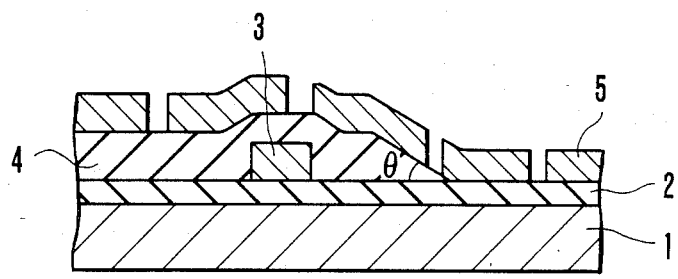
FIG. 8 is a fragmentary sectional view showing another embodiment of the invention.

Further, in order to alleviate abrupt rise of the element 5a near the edge of the conductor 3, the thickness of the second insulating layer 4 is selected to be equal to or more than 0.25 $\mu$m. The abrupt rise of the element leads to an undesirable polarization, thereby preventing propagation of the magnetic bubble. The same problems may occur along the shoulder 60. It is, therefore, preferred that the thickness of the second insulating layer 4 gradually changes, as shown in FIG. 8. In this second embodiment, an angle $\theta$ defining the slope of the second insulating layer 4 or gradual inclination of the shoulder 60 is preferably 60° or less.

There are several methods for gradually changing the thickness of the second insulating layer 4. For example, using a photoresist film which greatly absorbs a short-wave ultraviolet ray, a photoresist pattern having an inverted trapezoidal shape is formed on an insulating film and is dry-etched to highly precisely obtain the insulating layer 4 having a declining slope, as shown in FIG. 8.

According to the present invention, even in the magnetic bubble memory device having magnetic bubble propagation paths of different pattern periods, the thickness of the insulating layer under the propagation path can be changed in accordance with the propagation path period, thereby obtaining an optimum distance or spacing l between each propagation path and the magnetic film for holding magnetic bubbles. As a result, a high packing density magnetic bubble memory device having a wide operating margin can be obtained. Furthermore, the insulating layer has a declining slope so as to gradually change the distance between a propagation path and the magnetic film, thereby preventing degradation of the operating margin.

Furthermore, even if the distance between a magnetic bubble propagation path and the magnetic film changes for a given purpose at a portion excluding the minor loops, the effect of the present invention will not be impaired. For example, the distance is generally decreased at a portion for detecting the magnetic bubble so as to obtain a high detection reliability.

In the major loop (or major line), part of the propagation path may have a period smaller than that of the remaining portion due to limitations imposed by a particular circuit design. In this case, the distance between the propagation path and the magnetic film in the major loop (or major line) need not be changed.

Even if portions having slightly different periods are present in the major loop (or major line), the distance between the propagation path and the magnetic film need not be changed in accordance with this slight difference. Therefore, it is apparent that the distance between the propagation path and the magnetic film in the minor loop having a period smaller than that in the major loop (or major line) must be preset to be smaller than that in the major loop (or major line).

What is claimed is:
1. A magnetic bubble memory device comprising:
a magnetic film for holding magnetic bubbles;
a first insulating layer formed on said magnetic film;
a conductive layer selectively formed on said first insulating layer;
a second insulating layer formed on said conductive layer and part of said first insulating layer, for surrounding said conductive layer; and
a bubble propagation path layer which is patterned on said second insulating layer and said first insulating layer to provide propagation path patterns of different pattern periods;
wherein the distance between said magnetic film and said bubble propagation path layer is made smaller at a propagation pattern of shorter period than at a propagation pattern of longer period.
2. A magnetic bubble memory device as recited in claim 1 wherein said second insulating layer has at an edge a shoulder, said shoulder terminating in the surface of said first insulating layer to provide part of the first insulating layer which is not covered with the second insulating layer, and said bubble propagation path layer is patterned on said second insulating layer and the part of said first insulating layer not covered with said second insulating layer.

3. A magnetic bubble memory device as recited in claim 2 wherein said shoulder is gradually inclined.

4. A magnetic bubble memory device as recited in claim 3 wherein the inclination angle is 60° or less.

5. A magnetic bubble memory device as recited in claim 1 wherein said second insulating layer has a thickness of 0.25 μm or more.

6. A magnetic bubble memory device as recited in claim 1 wherein said distance is 0.35 μm or more for the larger period which is 12 μm or more and is 0.25 μm or less for the smaller period which is 6 μm or less.

* * * * *